United States Patent
Cheng (10) Patent No.: US 8,956,979 B2
(45) Date of Patent: Feb. 17, 2015

(54) SYSTEMS AND METHODS FOR IMPROVING FRONT-SIDE PROCESS UNIFORMITY BY BACK-SIDE METALLIZATION

(71) Applicant: Skyworks Solutions, Inc., Woburn, MA (US)

(72) Inventor: Kezia Cheng, Lowell, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 51 days.

(21) Appl. No.: 13/678,243

(22) Filed: Nov. 15, 2012

(65) Prior Publication Data

US 2013/0143411 A1   Jun. 6, 2013

Related U.S. Application Data

(60) Provisional application No. 61/561,217, filed on Nov. 17, 2011, provisional application No. 61/594,861, filed on Feb. 3, 2012.

(51) Int. Cl.
| | | |
|---|---|---|
| *H01L 21/30* | (2006.01) | |
| *H01L 21/3065* | (2006.01) | |
| *H01L 21/67* | (2006.01) | |
| *H01L 21/677* | (2006.01) | |
| *H01L 21/687* | (2006.01) | |
| *H01L 21/02* | (2006.01) | |
| *H01L 21/311* | (2006.01) | |

(52) U.S. Cl.
CPC ...... *H01L 21/3065* (2013.01); *H01L 21/67069* (2013.01); *H01L 21/6715* (2013.01); *H01L 21/30* (2013.01); *H01L 21/67757* (2013.01); *H01L 21/6875* (2013.01); *H01L 21/0217* (2013.01); *H01L 21/02299* (2013.01); *H01L 21/31116* (2013.01)
USPC .......................................................... 438/710

(58) Field of Classification Search
USPC .............. 117/84, 86; 118/723 I; 156/345.48; 174/565; 257/19, 295, 347, 439, 499, 257/503, 506, 616, 66, 750, 76; 313/146; 361/234, 303; 378/35; 427/569; 429/489; 430/5; 438/108, 15, 286, 29, 438/299, 301, 405, 406, 457, 48, 493, 5, 438/614, 710, 795
See application file for complete search history.

(56) References Cited

U.S. PATENT DOCUMENTS

| | | | | |
|---|---|---|---|---|
| 4,543,592 | A | * | 9/1985 | Itsumi et al. .................. 257/369 |
| 5,529,862 | A | * | 6/1996 | Randall ............................ 430/5 |
| 5,688,358 | A | * | 11/1997 | Tanaka et al. ............ 156/345.48 |
| 2002/0076625 | A1 | * | 6/2002 | Shoki et al. ........................ 430/5 |
| 2004/0124452 | A1 | * | 7/2004 | Wellhausen et al. .......... 257/295 |
| 2006/0169576 | A1 | * | 8/2006 | Brown et al. ............ 204/192.11 |
| 2011/0140118 | A1 | * | 6/2011 | Ramdani ......................... 257/66 |

* cited by examiner

*Primary Examiner* — Duy Deo
*Assistant Examiner* — Erin Bergner
(74) *Attorney, Agent, or Firm* — Knobbe, Martens, Olson & Bear, LLP (57) ABSTRACT

Disclosed are systems and methods for improving front-side process uniformity by back-side metallization. In some implementations, a metal layer can be formed on the back side of a semiconductor wafer prior to certain process steps such as plasma-based processes. Presence of such a back-side metal layer reduces variations in, for example, thickness of a deposited and/or etched layer resulting from the plasma-based processes. Such reduction in thickness variations can result from reduced variation in radio-frequency (RF) coupling during the plasma-based processes. Various examples of wafer types, back-side metal layer configurations, and plasma-based processes are disclosed.

18 Claims, 6 Drawing Sheets

SYSTEMS AND METHODS FOR IMPROVING FRONT-SIDE PROCESS UNIFORMITY BY BACK-SIDE METALLIZATION

CROSS-REFERENCE TO RELATED APPLICATIONS

This application claims priority to U.S. Provisional Application Nos. 61/561,217 filed Nov. 17, 2011 and entitled "SYSTEMS AND METHODOLOGIES FOR IMPROVING FRONT-SIDE PROCESS UNIFORMITY BY BACK-SIDE METALLIZATION," and 61/594,861 filed Feb. 3, 2012 and entitled "SYSTEMS AND METHODOLOGIES FOR IMPROVING FRONT-SIDE PROCESS UNIFORMITY BY BACK-SIDE METALLIZATION," each of which is expressly incorporated by reference herein in its entirety.

BACKGROUND

1. Field

The present disclosure generally relates to methods and systems for processing semiconductor wafers.

2. Description of the Related Art

Semiconductor devices are commonly implemented on a semiconductor wafer and separated into individual devices. Formation of such devices typically includes processing of the wafer utilizing various process steps. Such process steps typically include deposition of materials, as well as removal of materials in some selected manners, to form desired features on the wafer.

In some implementations, the such deposition and removal of materials can be achieved by techniques such as plasma-based processes. A plasma-enhanced chemical vapor deposition (PECVD) process is an example of such a plasma-based deposition process. A reactive ion etching process is an example of such a plasma-based removal process.

SUMMARY

In accordance with a number of implementations, the present disclosure relates to a method for processing a semiconductor wafer. The method includes providing a wafer having a back side and a front side. The method further includes forming a metal layer on one side of the wafer. The method further includes performing a plasma-based process on the other side of the wafer. The metal layer facilitates improved uniformity in thickness of a layer resulting from the plasma-based process.

In some embodiments, the metal layer can be formed on the back side of the wafer and the plasma-based process can be performed on the front side of the wafer. In some embodiments, the metal layer can cover substantially the entire area of the back side of the wafer. In some embodiments, the wafer can be a gallium arsenide (GaAs) wafer.

In some embodiments, the metal layer can include tungsten titanium (W—Ti). The metal layer metal layer can be formed using a sputtering process. The metal layer can have a thickness in a range of approximately 500 angstroms to 2,000 angstroms. Other thickness ranges can also be implemented.

In some embodiments, the plasma-based process can include a deposition process. The deposition process can include a plasma-enhanced chemical vapor deposition (PECVD) process.

In some embodiments, the plasma-based process can include an etching process. The etching process can include a reactive ion etching process.

In some embodiments, the layer resulting from the plasma-based process can include a nitride layer. In some embodiments, the improved uniformity can include a reduction in relative standard deviation of measured thickness values by a factor of at least two when compared to similar thickness values corresponding to a wafer without a metal layer on its back side. The reduction in relative standard deviation can be by a factor of about three.

According to some implementations, the present disclosure relates to a system for processing a semiconductor wafer. The system includes a back-side process system configured to form a metal layer on a back side of a wafer to yield a back-side metalized wafer. The system further includes a front-side process system configured to perform a plasma-based process on a front side of the back-side metalized wafer. The metal layer is configured to facilitate improved uniformity in thickness of a layer resulting from the plasma-based process.

In a number of teachings, the present disclosure relates to a method for processing a semiconductor wafer. The method includes providing a wafer. The method further includes forming a metal layer on one side of the wafer to reduce variation in radio-frequency (RF) coupling during a plasma-based process on the other side of the wafer.

In some embodiments, the method can further include performing the plasma-based process on the other side of the wafer. In some embodiments, the method can further include removing the metal layer after the plasma-based process.

In some embodiments, the metal layer can include a tungsten titanium (W—Ti) layer. In some embodiments, the wafer can include a gallium arsenide (GaAs) wafer.

In some embodiments, the variation in RF coupling can include a contribution from one or more features defined by or associated with a wafer handling device. The wafer handling device can include a wafer platen or a wafer chuck.

In some implementations, the present disclosure relates to a method for processing a semiconductor wafer. The method includes obtaining a wafer that has not been subjected to a plasma deposition or etching process. The method further includes metalizing a back side of the wafer. The method further includes sending the metalized wafer for further processing.

In some embodiments, the method can further include receiving the metalized wafer and performing a plasma deposition process or a plasma etching process on a front side of the metalized wafer.

In some implementations, the present disclosure relates to a method for processing a semiconductor wafer. The method includes obtaining a metalized wafer having a metal layer formed on its back side, with the metalized wafer not having been subjected to a plasma deposition or etching process. The method further includes positioning the metalized wafer on a plasma processing apparatus. The method further includes performing the plasma deposition process or the plasma etching process on a front side of the metalized wafer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Semiconductor processes typically have some inherent non-uniformity. Depending on, for example, mask and technology, the wafer maps can have non-uniform patterns that are radial, along a lateral direction, and/or random. In an example context of a plasma process, effects associated with radio-frequency (RF) coupling can yield such patterns, which in turn can contribute to significant failure rates.

Figure 1:
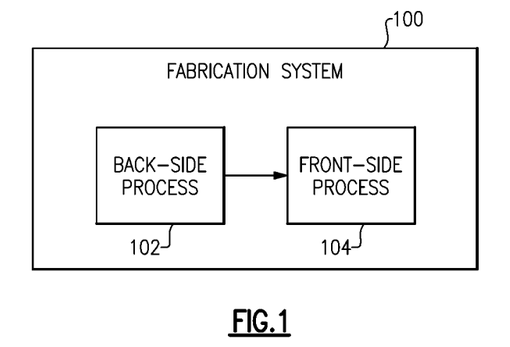
FIG. 1 schematically shows a fabrication system having one or more features described herein.

FIG. 1 shows that in some implementations, a semiconductor fabrication system 100 can be configured to include one or more features as described herein. The fabrication system 100 can include a back-side process component 102 and a front-side component 104. In some implementations, the back-side process component 102 can be configured to include a back-side metallization process that yields wafers whose backsides are metalized. Such back-side metalized wafers can then have their front-sides processed by the front-side process component 104 so as to yield desired devices (such as integrated circuits) on the wafers. For the purpose of description, it will be understood that the back-side process component 102 and the front-side process component 104 can be parts of a single facility, or belong to different facilities.

In such fabrication systems, plasma processes can be an integral and important part of semiconductor device fabrication. Applications of such plasma processes can include dry etching of metals, dielectrics and semiconductors; chemical vapor deposition of thin films; and oxygen plasma descum for organics removal. While each of these example processes can play an important role in the performance of a device being fabricated, process uniformity across a given wafer can also be important for consistent probe yield. If a plasma process condition varies drastically on the wafer (e.g., from the center of the wafer to the edge), device performance can vary at different locations on the wafer, and probe yield can be affected.

Some parameters that are important in a plasma process can include temperature, gas flow, gas chemistries, pressure and powers. Each of these parameters can modify the etching or deposition process characteristics. As described herein, overall process uniformity can be enhanced by metalizing the backside of a wafer. By way of an example, GaAs devices can be fabricated on semi-insulating substrates with a bulk resistivity on the order of $10^8$ Ω-cm. The high resistivity of the substrate can inhibit efficient coupling of RF power during a plasma process. Such a phenomenon can be more pronounced at the front end of the wafer fabrication process where the metalized area is usually small. Examples of uniformity comparison with and without the back-side metallization are described herein in greater detail. As also described herein, improved uniformity facilitated by the back-side metallization can translate into improved test parameters and yield gain.

A uniform wafer map with high yield is a very desirable goal of semiconductor fabrication processes. However, such a desirable goal may not be realized for a number of reasons. Quite often, a wafer map can display a distinctive pattern that is caused by one or a combination of several processes. Micro-loading effect in a plasma etch process can also cause local etch non-uniformity.

Described herein are systems and methodologies for achieving an improved uniformity on a macro scale (e.g., at a wafer level) resulting from processes such as a plasma process. By way of an example, such a plasma process is described in the context of an effect of radio-frequency (RF) coupling on plasma process uniformity.

Figure 2:
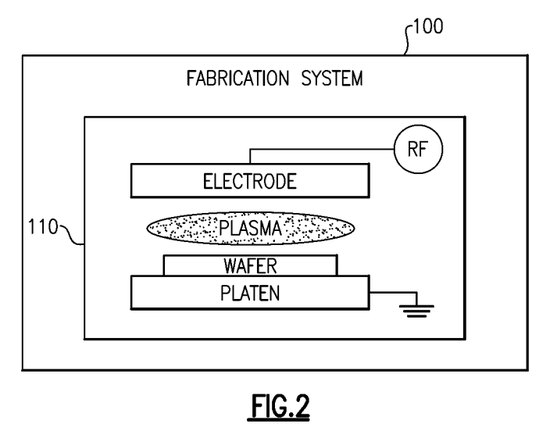
FIG. 2 shows that the fabrication system can include a plasma etch apparatus that can yield more uniform results on macro scale of wafers when such wafers have back-side metallization.

FIG. 2 schematically depicts a plasma process apparatus 110 that can be a part of the fabrication system 100. In some implementations, such an apparatus can be a reactive ion etch (RIE) apparatus or a plasma-enhanced chemical vapor deposition (PECVD) apparatus. In an example of a capacitively coupled plasma reactor with a parallel-plate configuration, RF power is depicted as being applied to one of the electrodes (upper one in the example of FIG. 2) while the other electrode (depicted as a platen in FIG. 2) is depicted as being electrically grounded. A wafer is shown to be positioned on the platen and subjected to plasma due to the applied RF power.

It will be understood that the plasma process apparatus 110 of FIG. 2 can be configured in other ways. For example, RF power can be applied to the platen and the top electrode can be grounded. In another example, both of the electrodes (e.g., top electrode and platen) can be RF biased. Other configurations are also possible.

In the context of gallium arsenide (GaAs) processes, GaAs devices can be built on a semi-insulating substrate with a bulk resistivity on the order of $10^8$ Ω-cm. When a GaAs wafer having such a high resistivity (which as needed or desirable for device fabrication) is subjected to the RIE system 110, the high resistivity can also impede effective RF power coupling. In some situations, such an effect can lead to non-uniform etching or deposition.

Figure 3:
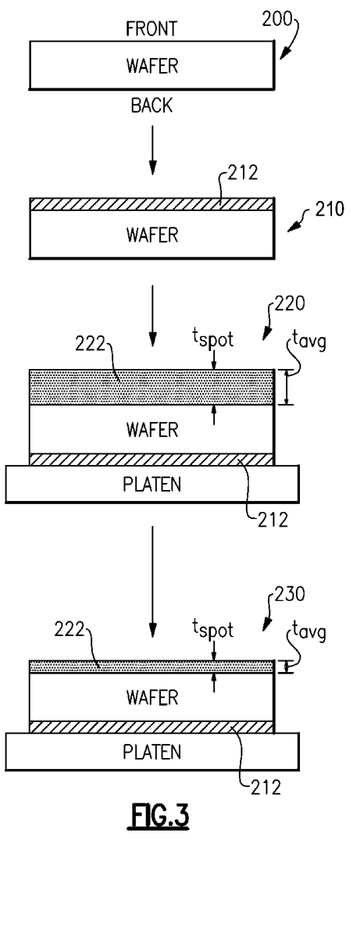
FIG. 3 shows an example sequence of back-side metallization and front-side process performed on a wafer to demonstrate improved uniformity provided by the back-side metallization.
Figure 4:
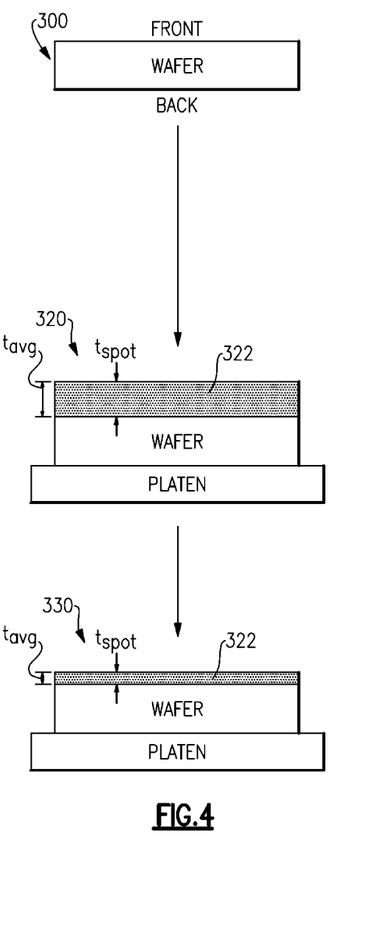
FIG. 4 shows an example sequence of front-side process performed on a wafer without the back-side metallization as a reference for comparison with the example of FIG. 3.

Described herein is an example of how back-side metallization of a semiconductor wafer can result in improved RF power coupling during a plasma process so as to yield improved uniformity in etching or deposition. To demonstrate such an improvement, four GaAs mechanical wafers were used in an experiment. Two of the wafers were provided with back-side metallization; and the other two did not have such metallization. FIG. 3 shows various stages of plasma processing of a back-metalized wafer 200, and FIG. 4 shows various stages of plasma processing of a wafer 300 that does not have back-side metallization.

To obtain back-side metallization, the two example wafers were sputtered with approximately 1,000 angstroms of tungsten titanium (W—Ti) on the backside. During such a sputtering process, each wafer rested on a holding device configured so that the front surface did not come into contact with the platen of the sputtering system. In FIG. 3, the resulting metalized configuration 210 is depicted as a metal layer 212 being formed on the back-side of the wafer 200. In some embodiments, the metal layer 212 can have a thickness in a range of 10 angstroms to 5 microns, 100 angstroms to 1 micron, 200 angstroms to 5,000 angstroms, 400 angstroms to 3,000 angstroms, 500 angstroms to 2,000 angstroms, 600 angstroms to 1,500 angstroms, 700 angstroms to 1,300 angstroms, 800 angstroms to 1,200 angstroms, or 900 angstroms to 1,100 angstroms.

Both groups of wafers (with and without back-side metallization) then received deposition of approximately 7,500 angstrom compressive silicon nitride film in a Novellus PECVD (plasma-enhanced chemical vapor deposition) apparatus. In FIG. 3, configuration 220 shows a nitride layer 222 formed on the front side of the wafer. In FIG. 4, configuration 320 shows a nitride layer 322 formed on the front side of the wafer. For each nitride layer, an average thickness $t_{avg}$ (about 7,500 angstroms in this example) and an example spot thickness $t_{spot}$ are shown.

The nitride thickness was measured at 25 different spot locations on each nitride layer (with a 12 mm edge exclusion) using a Nanospec 6100 reflectometer. Some measurement results (approximate values) are listed or summarized in Tables 1A-1C.

The wafers were then put through a short nitride etch in a RIE apparatus, utilizing etch chemistry with $SF_6$ being the main etch gas. The etch recipe was configured to remove about 1,500 angstroms of the nitride layer so that there was enough nitride remaining on the wafer for mapping. In FIG. 3, configuration 230 shows the nitride layer 222 after etching. In FIG. 4, configuration 330 shows the nitride layer 322 after etching. For each nitride layer, an average thickness $t_{avg}$ and an example spot thickness $t_{spot}$ are shown.

The nitride thickness was measured again at 25 different spot locations on each etched nitride layer. Some measurement results (approximate values) are also listed or summarized in Tables 1A-1C.

Table 1A lists measured thicknesses of the deposited nitride layers, before and after etching, for wafers without back-side metallization. Based on such measurements, etched thickness values (calculated) are also listed. Table 1B lists measured thicknesses of the deposited nitride layers, before and after etching, for wafers with back-side metallization. Based on such measurements, etched thickness values (calculated) are also listed. Measured values are approximate values. Table 1C lists some summary values for the measured

TABLE 1A

| Wafer | Deposited nitride thickness (Angstroms) | Nitride thickness after etch (Angstroms) | Etched thickness (Angstroms) |
| --- | --- | --- | --- |
| 1 | 5022 | 2376 | 2646 |
| 2 | 5029 | 2353 | 2676 |
| 3 | 5019 | 2380 | 2639 |
| 4 | 5002 | 2399 | 2603 |
| 5 | 5035 | 2395 | 2640 |
| 6 | 5048 | 2372 | 2676 |
| 7 | 5039 | 2416 | 2623 |
| 8 | 5002 | 2435 | 2567 |
| 9 | 5025 | 2419 | 2606 |
| 10 | 5086 | 2220 | 2866 |
| 11 | 5068 | 2183 | 2885 |
| 12 | 4940 | 2198 | 2742 |
| 13 | 4937 | 2370 | 2567 |
| 14 | 4973 | 2382 | 2591 |
| 15 | 4977 | 2366 | 2611 |
| 16 | 5021 | 2185 | 2836 |
| 17 | 5092 | 2195 | 2897 |
| 18 | 5069 | 2247 | 2822 |
| 19 | 5087 | 2220 | 2867 |
| 20 | 5027 | 2234 | 2793 |
| 21 | 4998 | 2330 | 2668 |
| 22 | 5013 | 2302 | 2711 |
| 23 | 4981 | 2324 | 2657 |
| 24 | 4945 | 2225 | 2720 |
| 25 | 5072 | 2219 | 2853 |

TABLE 1B

| Wafer | Deposited nitride thickness (Angstroms) | Nitride thickness after etch (Angstroms) | Etched thickness (Angstroms) |
| --- | --- | --- | --- |
| 1 | 5057 | 2385 | 2672 |
| 2 | 5060 | 2427 | 2633 |
| 3 | 5061 | 2419 | 2642 |
| 4 | 5067 | 2429 | 2638 |
| 5 | 5073 | 2443 | 2630 |
| 6 | 5076 | 2478 | 2598 |
| 7 | 5074 | 2484 | 2590 |
| 8 | 5070 | 2490 | 2580 |
| 9 | 5062 | 2465 | 2597 |
| 10 | 5092 | 2416 | 2676 |
| 11 | 5095 | 2411 | 2684 |
| 12 | 5092 | 2416 | 2676 |
| 13 | 5102 | 2457 | 2645 |
| 14 | 5092 | 2462 | 2630 |
| 15 | 5105 | 2475 | 2630 |
| 16 | 5118 | 2444 | 2674 |
| 17 | 5097 | 2437 | 2660 |
| 18 | 5070 | 2453 | 2617 |
| 19 | 5087 | 2465 | 2622 |
| 20 | 5097 | 2480 | 2617 |
| 21 | 5112 | 2481 | 2631 |
| 22 | 5091 | 2420 | 2671 |
| 23 | 5089 | 2436 | 2653 |
| 24 | 5099 | 2439 | 2660 |
| 25 | 5089 | 2422 | 2667 |

TABLE 1C

| | Without back-side metallization (BSM) | With back-side metallization (BSM) |
| --- | --- | --- |
| Average deposited nitride thickness (Angstroms) | 5020 | 5085 |
| Std. Dev. of deposited nitride thickness | 45 | 17 |
| Average nitride thickness after etch (Angstroms) | 2310 | 2445 |
| Std. Dev. of nitride thickness after etch | 87 | 28 |

In Table 1C, "BSM" refers to back-side metallization. It is noted that for the nitride deposition thickness, the standard of deviation (StdDev) is about 45 angstroms for the without-BSM case, and about 17 for the with-BSM case. In terms of relative standard deviation ((StdDev/Average)×100), the without-BSM case yields a value of about 0.90%, and the with-BSM case yields a value of about 0.33% which is about three times less than that of the without-BSM case.

For the nitride thickness after etching, the standard of deviation is about 87 for the without-BSM case, and about 28 for the with-BSM case. In terms of relative standard deviation, the without-BSM case yields a value of about 3.7%, and the with-BSM case yields a value of about 1.1% which is again about three times less than that of the without-BSM case. Similar results are obtained for the etched thickness, which is calculated as the difference between deposited thickness and after-etching thickness.

It is noted that the spot thickness measurements for the non-BSM case excluded significant edge portions where readily apparent non-uniformity exist (manifested as fringes). Thus, if thickness measurements include such edge portions, then the resulting standard deviations for the non-BSM case will be worse than those listed in Table 1C. In such a context, the improvement of thickness uniformity provided by back-side metallization can be greater than the three-fold example described herein.

Table 2 shows a summary similar to that of Table 1C, for measurement results from additional runs with different deposition and after-etching thicknesses.

TABLE 2

|  | Without back-side metallization (BSM) | With back-side metallization (BSM) |
| --- | --- | --- |
| Average deposited nitride thickness (Angstroms) | 7041 | 7112 |
| Std. Dev. of deposited nitride thickness | 67 | 22 |
| Average nitride thickness after etch (Angstroms) | 4525 | 4750 |
| Std. Dev. of nitride thickness after etch | 121 | 27 |

For the nitride deposition thickness, the standard of deviation (StdDev) is about 67 angstroms for the without-BSM case, and about 22 for the with-BSM case. In terms of relative standard deviation ((StdDev/Average)×100), the without-BSM case yields a value of about 0.95%, and the with-BSM case yields a value of about 0.31% which is a greater improvement than the example described in reference to Table 1C. For the nitride thickness after etching, the standard of deviation is about 121 for the without-BSM case, and about 27 for the with-BSM case. In terms of relative standard deviation, the without-BSM case yields a value of about 2.7%, and the with-BSM case yields a value of about 0.57% which is again a greater improvement than the example described in reference to Table 1C The foregoing reductions in standard deviations of measured spot thicknesses due to back-side metallization are significant and indicate significantly improved uniformity in thickness. Further, it is noted that such improved uniformity is obtained in both deposition (e.g., deposited nitride thickness) and etching (e.g., post-etch nitride thickness) applications.

Figure 5:
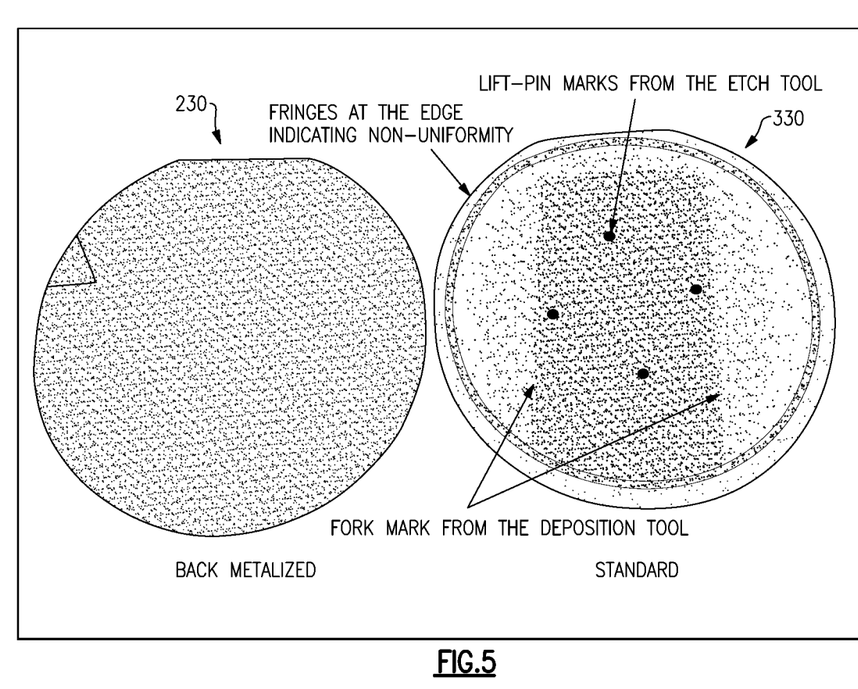
FIG. 5 shows a comparison of the example wafers of FIGS. 3 and 4.

FIG. 5 shows a comparison of a back-side metalized (BSM) wafer 230 (indicated as "BACK METALIZED") and a non-BSM wafer 330 (indicated as "STANDARD") resulting from the foregoing experiment. It can be seen that the two wafers appear markedly different. The BSM wafer has a generally uniform shade across substantially the entire surface indicating generally uniform thickness. The non-BSM wafer shows fringes at the edge (e.g., a first band about 14 mm wide on the edge, and a second thinner ring inside the first band) indicating non-uniformity in thickness. Further, the non-BSM wafer shows a broad stripe about 2" wide down the middle of the wafer. It is believed that boundaries of such a stripe correspond to imprints of the wafer handler of the nitride deposition apparatus. Further, the center portion of the non-BSM wafer has four dots, which are believed to correspond to marks left by the lift-pins on the chuck of the etch apparatus.

Figure 6:
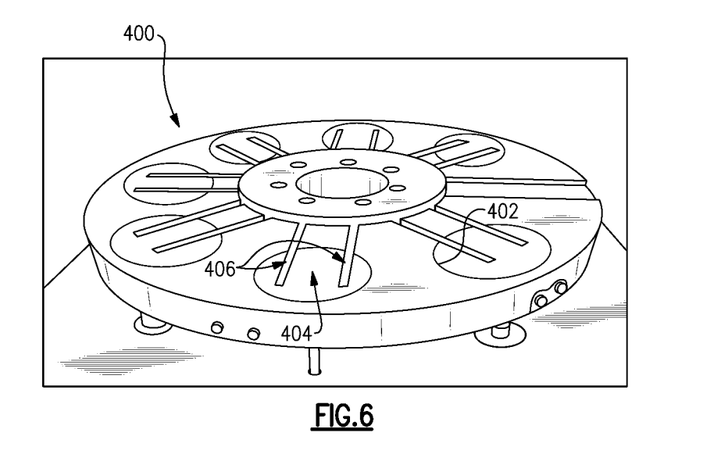
FIG. 6 shows a wafer platen of a deposition system utilized for the example wafers of FIG. 5.

Some of the example undesirable features shown in the non-BSM wafer 330 of FIG. 5 can be explained by considering the example deposition system 400 shown in FIG. 6. In the example system (e.g., Novellus PECVD system), a wafer platen 402 is shown to include a plurality of recesses 404 for receiving wafers. Positioning and lifting of wafers into and out of the recesses 404 can be accommodated by fork shaped wafer handlers 406. In the non-BSM wafer 330 of FIG. 5, the 2" stripe generally corresponds to an area between the two prongs of the fork.

It is noted that in the example non-BSM wafer 330 of FIG. 5, the silicon nitride outside of the fork region transitioned to a different color. Reflectometry measurement indicated that the silicon nitride in this region was about 200 to 500 angstrom thinner compared to the region of the wafer inside the fork. Thus, one can see that the wafer handler can have undesirable impact on a wafer's thickness uniformity.

Figure 7:
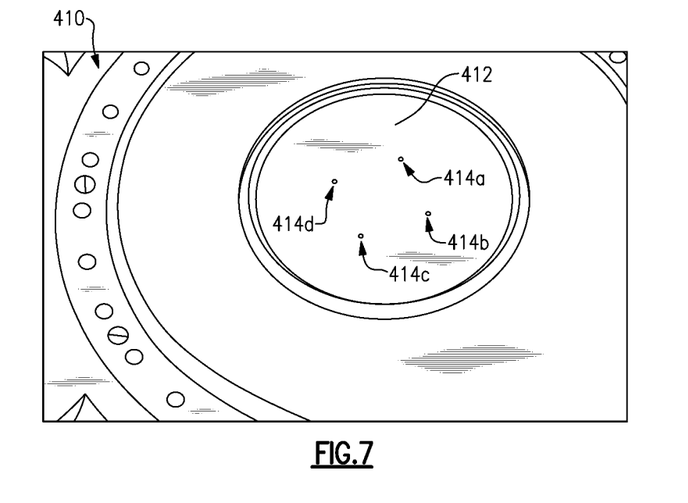
FIG. 7 shows a wafer chuck of an etch tool utilized for the example wafers of FIG. 5.

FIG. 7 shows a wafer chuck 410 of an etch tool. The chuck 410 is shown to define a wafer-receiving area 412. Within the wafer-receiving area 412 are shown four lift-pins 414a-414d that facilitate positioning and removal of a wafer. Each of such pins has a diameter of approximately 3 mm.

The example non-BSM wafer 330 of FIG. 5 shows a pattern of four dots that correspond to the four lift-pins. The dots on the non-BSM wafer were measured to have a thickness of about 4565 angstroms. In comparison, neighboring areas outside the fork region have an average thickness of about 4362 angstroms. Thus, one can see that the pin pattern of the RIE chuck contributes to a nitride thickness variation of about 200 angstroms. It is believed that the four holes (machined in the chuck) for allowing retractions of the four lift-pins can yield a change in capacitance and therefore lessen RF coupling. Lower etch rate therefore resulted on the front of the wafer in the corresponding locations.

As seen in Table 1C, the back-metalized (BSM) wafer yielded slightly higher deposited nitride thickness. Repeating the experiment confirmed that the difference, although small, is generally consistent. Without back-metallization, the standard wafer had relatively high non-uniformity after nitride deposition. The standard deviation of the control wafer is 2.6 times higher than the back-metalized wafer.

After nitride etch, the uniformity disparity grew larger and the fork mark left by the wafer handler became more apparent. The standard deviation for the control and back-metalized wafer are 87 angstroms and 28 angstroms, respectively. The nitride thickness variation of the standard wafers is higher than the data had shown because of the approximately 0.5" edge exclusion used in the thickness mapping program.

When blank GaAs wafers were used in the experiment, the results clearly indicated that back-side metallization improved front-side PECVD and plasma-etch uniformity. To determine whether such an improvement can result in a measurable yield gain due to the improved uniformity, one can run a split lot on actual products. Accordingly, a pseudomorphic high electron mobility transistor (pHEMT) mask was selected where an RF parameter is sensitive to a selected dimension in the transistor structure. The selected dimension can be controlled by a dry-etch process in a RIE tool. Two of the wafers received about 1,000 angstrom of W—Ti on the back of the wafer. All wafers were randomized and then processed together.

Figure 8:
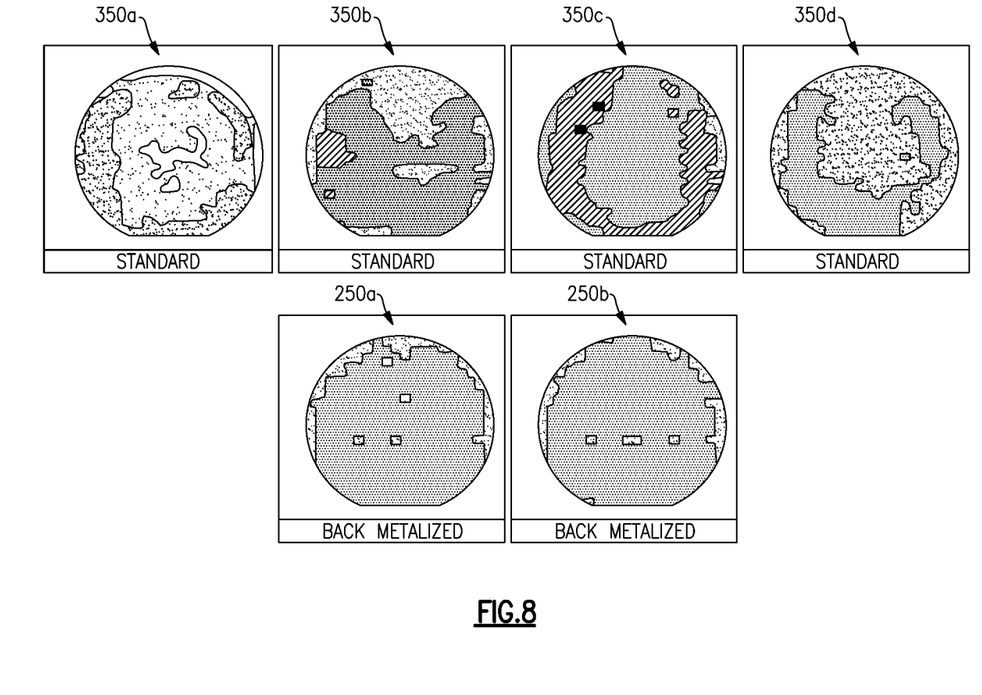
FIG. 8 shows example probe yield maps of wafers with and without back-side metallization.

FIG. 8 shows the wafer maps of the split lot. The RF parameter sensitive to the selected dimension showed a significant improvement with back-metallization. The two back-metalized wafers (250a, 250b) had about 10 percent higher probe yield and the most uniform wafer maps. The wafers 350a-350d (indicated as "STANDARD") do not have back-metallization. Comparing the two types of wafers, the improved yield can be attributed to the better control of the selected dimension of the etched pattern. The cross-wafer uniformity of the RF parameter has been successfully improved with the example W—Ti back metal. Under-etched and over-etched regions were effectively eliminated or reduced, thereby improving yield. It will be understood that in some implementations, metals other than W—Ti can be used for back-metallization.

While it is not desired or intended to be bound by any particular theory, some observations can be made from the example measurements described herein. On average, the nitride at the edge of the non-BSM wafers has a thickness of approximately 5,696 angstroms which is about 1,400 angstroms thicker than that of the area outside of the fork mark. This result suggests that for a bare GaAs wafer (without BSM) with high bulk resistivity, the RF power coupling is relatively weak at the edge. Consequently, the etch rate in a RIE system is generally low at the edge of the wafer (e.g., the 0.5" edge band).

It is also noted that a cavity in the wafer chuck such as a lift-pin hole or wafer-handler recess in the platen can alter the capacitive and/or RF power coupling effectiveness and thereby affect the etch and/or deposition rates. In a semiconductor device where a dimension is important for device performance, this amount of variation can cause performance difference and yield loss. For example, if there is insufficient over-etch built-in in an etch recipe, areas with very low etch rates would have a smaller dimension and run a risk of incomplete etch. At the same time, areas with high etch rates may experience an enlarged dimension and even surface damage.

Figure 9:
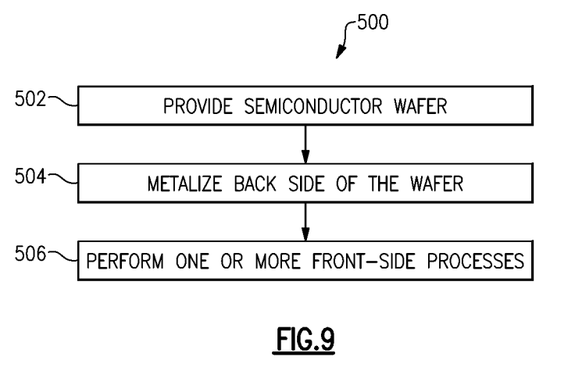
FIG. 9 shows a process that can be implemented to yield a processed wafer having one or more features described herein.

FIG. 9 shows a process 500 that can be implemented to achieve desirable results associated with a back-side metalized wafer. In block 502, a semiconductor wafer can be provided or formed. In block 504, one side (e.g., back side) of the wafer can be metalized so as to form a metal layer. In some implementations, such metallization can yield metal layer that covers substantially the entire surface of the back side. In block 506, one or more front-side processed can be performed on the back-side metalized wafer.

The present disclosure demonstrates that, among others, plasma process uniformity in a parallel plate configuration (capacitively coupled plasma reactor) can have intrinsically poor uniformity for a GaAs wafer. The high resistivity of the semi-insulating substrate can inhibit efficient RF power coupling.

A smooth uninterrupted wafer chuck can be desirable for process uniformity consideration. However, such a design may not be practical since the wafer typically needs to be picked up from the back side. Accordingly, wafer chucks typically have features (such as cavities) to accommodate handling of wafers. Such cavities that facilitate these wafer-handling features can disrupt the capacitive and/or RF power coupling. As described herein, a wafer map can be impacted significantly by such wafer-chuck pattern(s). This phenomenon can be more pronounced in the front end of the process where metallization area is small. Plasma processes towards the back end of the production flow can be less pronounced (sensitive) due to the larger front side metallization area.

It is noted that in similar experiments with different dielectrics and polymer films, the results are generally the same. Without back metallization, the standard wafers have higher non-uniformity after plasma etch.

In the context of GaAs wafers, a conductive metal coating on the back of a GaAs wafer greatly improves both the nitride deposition and plasma-etch uniformity. Imprint from the wafer handler and the color bands on the edge of the wafer that are normally present are substantially eliminated or reduced. The improved uniformity typically translates into yield gains on masks that are sensitive to dimension (e.g., critical dimension) variation in structures such as a pHEMT structure.

In some implementations, one or more features of the present disclosure can be implemented in other process configurations. For example, tool configurations such as a high density inductively coupled plasma (ICP) etch tool and an electro-static chuck may respond similarly to back metallization. In addition, effectiveness of front-side metallization may be configured appropriately to aid coupling.

As described herein, back-metalizing a wafer can be a practical solution to yield issues caused by a non-uniformity nature of a GaAs wafer in a capacitively coupled plasma reactor. The example 1,000 angstrom layer of W—Ti does not clog the grinding wheel and therefore can be implemented into a number of production flows. The example W—Ti film can be etched off (e.g., in 70° C. $H_2O_2$), if desired, after the wafer has been mounted on a carrier and before the grind operation.

Applicant has demonstrated that back-side metallization of a wafer can improve front-side process uniformity. Such a demonstration is described in the context of improved plasma process uniformity. It will be understood, however, that other front-side processes can also benefit from the back-side metallization technique. As applied to plasma processes, such improved plasma uniformity on a production mask can result in increased probe yield. For example, nitride deposition and nitride etch processes can yield significantly improved uniform results with back-side metallization. Other deposition and/or etch processes associated with plasma process (and/or other front-side processes) can also benefit from back-side metallization.

The example back-side metallization layers are described in the context of a W—Ti layer having a thickness of approximately 1,000 angstroms. Such a layer is described as covering substantially the entire back-side of wafers. It will be understood, however, that one or more features of the present disclosure can also be implemented in configurations that vary from the foregoing examples. For example, different metals, alloys, conductive materials, adhesion layers, seed layers, barrier layers, and/or any combination thereof can be utilized with or instead of the W—Ti layer. In another example, different thicknesses of such metallization layers can be implemented. In yet another example, such back-side metallization layers can cover substantially the entire back-side or one or more selected portions of the back-side.

In some embodiments, such back-side metallization layers can also be segmented and/or have varying thickness profiles (e.g., by appropriate masking) to accommodate particular front-side designs. For example, there may be front-side deposition and/or etching related effects that depend on radial position or particular features associated with equipments; and such position-dependence can be addressed by appropriately configured back-side metallization layers.

The examples of back-side metallization are described herein in the context of plasma-related processes. It will be understood, however, that one or more features of the present disclosure can also be implemented in other wafer fabrication processes.

The examples of back-side metallization are described herein in the context of GaAs processes. It will be understood, however, that one or more features of the present disclosure can also be implemented in other semiconductor processes.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for processing a semiconductor wafer, the method comprising:
    providing a gallium arsenide (GaAs) wafer having a back side and a front side;
    depositing tungsten titanium (W—Ti) on one side of the GaAs wafer to form a W—Ti metal layer on the one side of the GaAs wafer; and
    performing a plasma-based process on the other side of the GaAs wafer, the W—Ti metal layer affecting at least one of an etch rate and a deposition rate during the plasma-based process so as to facilitate improved uniformity in thickness of a layer resulting from the plasma-based process.

2. The method of claim 1 wherein the W—Ti metal layer is formed on the back side of the GaAs wafer and the plasma-based process is performed on the front side of the GaAs wafer.

3. The method of claim 2 wherein the W—Ti metal layer covers substantially the entire area of the back side of the GaAs wafer.

4. The method of claim 2 wherein the W—Ti metal layer is formed using a sputtering process.

5. The method of claim 4 wherein the W-TI metal layer has a thickness in a range of approximately 500 angstroms to 2,000 angstroms.

6. The method of claim 2 wherein the plasma-based process includes a deposition process.

7. The method of claim 6 wherein the deposition process includes a plasma-enhanced chemical vapor deposition (PECVD) process.

8. The method of claim 2 wherein the plasma-based process includes an etching process.

9. The method of claim 8 wherein the etching process includes a reactive ion etching process.

10. The method of claim 2 wherein the layer resulting from the plasma-based process includes a nitride layer.

11. The method of claim 2 wherein the improved uniformity includes a reduction in relative standard deviation of measured thickness values by a factor of at least two when compared to similar thickness values corresponding to a GaAs wafer without a W—Ti metal layer on its back side.

12. A method for processing a semiconductor wafer, the method comprising:
    providing a gallium arsenide (GaAs) wafer; and
    depositing tungsten titanium (W—Ti) on one side of the GaAs wafer to form a W—Ti metal layer on the one side of the GaAs wafer to reduce variation in radio-frequency (RF) coupling during a plasma-based process on the other side of the GaAs wafer, the reduced variation in RF coupling facilitating improved uniformity in at least one of an etch rate and a deposition rate during the plasma-based process.

13. The method of claim 12 further comprising performing the plasma-based process on the other side of the GaAs wafer.

14. The method of claim 13 further comprising removing the W—Ti metal layer after the plasma-based process.

15. The method of claim 12 wherein the variation in RF coupling includes a contribution from one or more features defined by or associated with a wafer handling device.

16. The method of claim 15 wherein the wafer handling device includes a wafer platen.

17. The method of claim 15 wherein the wafer handling device includes a wafer chuck.

18. A method to process a semiconductor wafer, the method comprising:
    providing a gallium arsenide (GaAs) wafer;
    depositing tungsten titanium (W—Ti) on a back side of the GaAs wafer to form a W—Ti metal layer on the back side of the GaAs wafer; and
    performing a plasma-based process according to a front-side design on a front side of the GaAs wafer, the W—Ti metal layer including varying thickness profiles to accommodate the front-side design, the varying thickness profiles of the W—Ti metal layer affecting at least one of an etch rate and a deposition rate during the plasma-based process.

* * * * *